(12) United States Patent
Xie et al.

(10) Patent No.: US 12,379,430 B2
(45) Date of Patent: Aug. 5, 2025

(54) METHOD RELATED TO MAGNETIC FIELD INTERFERENCE AND SENSING SYSTEM

(71) Applicant: Wistron Corporation, New Taipei (TW)

(72) Inventors: Zhu-Xuan Xie, New Taipei (TW); Chih Hao Chiu, New Taipei (TW)

(73) Assignee: Wistron Corporation, New Taipei (TW)

( * ) Notice: Subject to any disclaimer, the term of this patent is extended or adjusted under 35 U.S.C. 154(b) by 245 days.

(21) Appl. No.: 18/323,417

(22) Filed: May 25, 2023

(65) Prior Publication Data

US 2024/0353508 A1    Oct. 24, 2024

(30) Foreign Application Priority Data

Apr. 21, 2023 (TW) ................... 112114911

(51) Int. Cl.
*G01R 33/02* (2006.01)
(52) U.S. Cl.
CPC ................... *G01R 33/02* (2013.01)

(58) Field of Classification Search
CPC .... G01R 33/02; G01R 33/025; G01R 33/007; G01R 33/0206; G01R 31/001; G01C 25/005
See application file for complete search history.

(56) References Cited

U.S. PATENT DOCUMENTS

| 10,899,469 | B2  |         | 1/2021 | Lai et al. |            |
|------------|-----|---------|--------|------------|------------|
| 2018/0265219 | A1 | *       | 9/2018 | Lai        | G01R 33/0385 |
| 2019/0178684 | A1 | *       | 6/2019 | Marauska   | G01R 33/025 |
| 2021/0139164 | A1 | *       | 5/2021 | Lai        | G01R 33/022 |

FOREIGN PATENT DOCUMENTS

CN          114200356          3/2022

* cited by examiner

*Primary Examiner* — Alvaro E Fortich
(74) *Attorney, Agent, or Firm* — JCIPRNET

(57) ABSTRACT

A method related to magnetic field interference and a sensing system are provided. In the method, magnetic field uniformity within a time period is determined. Movement situation within the time period is determined. Magnetic field interference situation is determined according to the magnetic field uniformity and the movement situation.

18 Claims, 15 Drawing Sheets

METHOD RELATED TO MAGNETIC FIELD INTERFERENCE AND SENSING SYSTEM

CROSS-REFERENCE TO RELATED APPLICATION

This application claims the priority benefit of Taiwan application serial no. 112114911 filed on Apr. 21, 2023. The entirety of the above-mentioned patent application is hereby incorporated by reference herein and made a part of this specification.

BACKGROUND

Technical Field

The disclosure relates a sensing technology, and in particular relates a method related to magnetic field interference and a sensing system.

Description of Related Art

Sensing data from sensors such as accelerometers, magnetometers, and gyroscopes may be configured to estimate the attitude angle of the object under test. However, in practical applications, the sensing data of the magnetometer is easily interfered. For example, metallic conductors, permanent magnets, power cords (i.e., electromagnetism), or electronic equipment in the environment such as desks, iron cabinets, and building reinforcement are sources of magnetic field interference. It is even difficult for the user to find the location of some sources of magnetic field interference, so it is difficult to stay away from all sources of magnetic field interference.

SUMMARY

In view of this, a method related to magnetic field interference and a sensing system are provided in the embodiments of the disclosure, in which the method related to magnetic field interference and the sensing system may accurately evaluate the magnetic field interference.

A method related to magnetic field interference in the embodiment of the disclosure includes (but is not limited to) the following operation. Magnetic field uniformity within a time period is determined. Movement situation within the time period is determined. Magnetic field interference situation is determined according to the magnetic field uniformity and the movement situation.

The sensing system of the embodiment of the disclosure includes (but is not limited to) a computing device. The computing device includes a memory and a processor. The memory is configured to store program code. The processor is coupled to the memory. The processor is configured to perform the following operation. Magnetic field uniformity within a time period is determined. Movement situation within the time period is determined. Magnetic field interference situation is determined according to the magnetic field uniformity and the movement situation.

Based on the above, the method related to magnetic field interference and the sensing system according to the embodiments of the disclosure may accurately evaluate the magnetic field interference based on the magnetic field uniformity and the movement situation.

In order to make the above-mentioned features and advantages of the disclosure comprehensible, embodiments accompanied with drawings are described in detail below.

DETAILED DESCRIPTION OF DISCLOSED EMBODIMENTS

Figure 1:
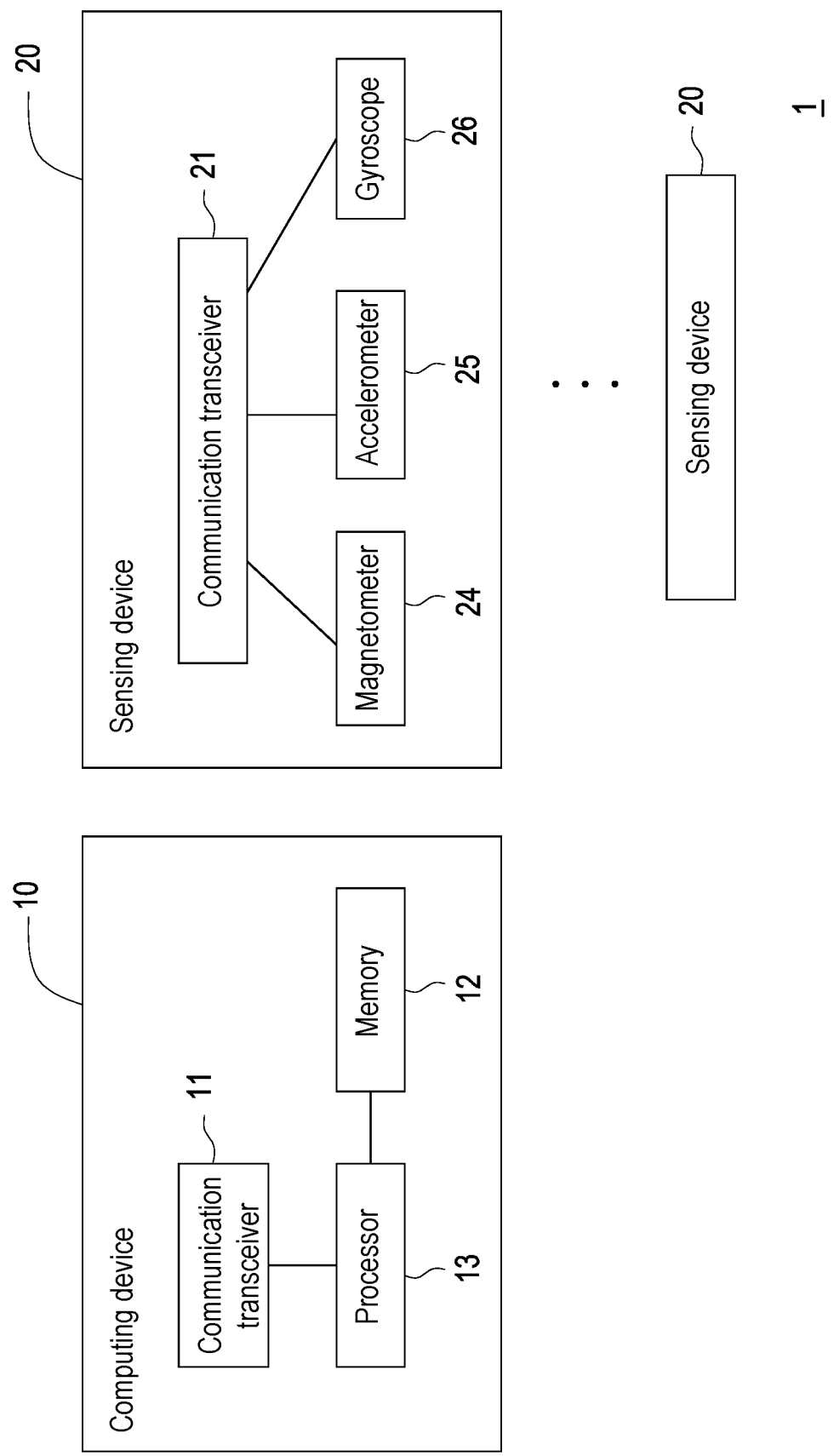
FIG. 1 is an element block diagram of a sensing system according to an embodiment of the disclosure.

FIG. 1 is an element block diagram of a sensing system 1 according to an embodiment of the disclosure. Referring to FIG. 1, the sensing system 1 includes (but not limited to) a computing device 10 and one or more sensing devices 20. The sensing system 1 may be applied in fields such as virtual reality, gaming, simulation, and medical treatment.

The computing device 10 may be a computer, a smartphone, a tablet, a server, an intelligent assistant device, a smart home appliance, a wearable device, or other electronic devices.

The computing device 10 includes (but not limited to) a communication transceiver 11, a memory 12, and a processor 13.

The communication transceiver 11 may be a communication transceiver circuit or a transmission interface card supporting Wi-Fi, Bluetooth, mobile communication, USB, or Ethernet. In one embodiment, the communication transceiver 11 is configured to transmit or receive data with an external device (e.g., the sensing device 20).

The memory 12 may be any type of fixed or movable random access memory (RAM), read only memory (ROM), flash memory, conventional hard disk drive (HDD), solid-state drive (SSD) or similar components. In one embodiment, the memory 12 is used to store program code, software modules, configuration, data, or files (e.g., sensing data, magnetic field, or magnetic field level), which are described in detail in subsequent embodiments.

The processor 13 is coupled to the communication transceiver 11 and the memory 12. The processor 13 may be a central processing unit (CPU), a graphics processing unit (GPU), or other programmable general-purpose or special-purpose microprocessors, a digital signal processor (DSP), a programmable controller, a field programmable gate array (FPGA), an application-specific integrated circuit (ASIC), a neural network accelerator, or other similar components, or combinations of components thereof. In one embodiment, the processor 13 is used to execute all or some of the operations of the computing system 10, and may load and execute various program codes, software modules, files, and data stored in the memory 12.

The sensing device 20 includes (but not limited to) a communication transceiver 21, a magnetometer 24, an accelerometer 25, and a gyroscope 26.

The implementation and functions of the communication transceiver 21 may refer to the description of the communication transceiver 11, and are not repeated herein.

The magnetometer 24 (or referred to as a magnetic field sensor) may be a Hall sensor, a magneto-resistive effect sensor, a magneto-impedance (MI) sensor, or a sensor of other magnetic field sensing technologies In one embodiment, the magnetometer 24 is configured to sense the strength and direction of the magnetic field.

For example, the magnetometer 24 measures three-axis magnetic forces $Mag_X$, $Mag_Y$, and $Mag_Z$. The mathematical expression of the magnetic field F is as follows:

$$F = \sqrt{Mag_X^2 + Mag_Y^2 + Mag_Z^2}. \quad (1)$$

Theoretically, in an environment with a uniform magnetic field, the strength of the magnetic field at any two locations should be the same.

The accelerometer 25 (or acceleration sensor) may be a microelectromechanical system (MEMS) accelerometer, a piezoresistive accelerometer, a capacitive accelerometer, a thermal convection accelerometer, or a sensor of other acceleration sensing technologies. In one embodiment, the accelerometer 25 is configured to sense the magnitude and direction of acceleration.

The gyroscope 26 may be a microelectromechanical systems (MEMS) gyroscope, an optical fiber gyroscope, an electrostatic gyroscope, a laser gyroscope, or a sensor of other angular velocity sensing technologies. In one embodiment, the gyroscope 26 is configured to sense the magnitude and direction of the angular velocity.

The magnetometer 24, the accelerometer 25, and the gyroscope 26 are coupled to the communication transceiver 21, and the communication transceiver 21 may transmit the sensing data of the magnetometer 24, the accelerometer 25, and the gyroscope 26 to other devices (e.g., the computing device 10). In one embodiment, the sensing device 20 includes a processor (not shown) to determine information such as magnetic field, acceleration, angular velocity, three-axis motion information, six-axis motion information, and/or nine-axis motion information, etc. In one embodiment, the magnetometer 24, the accelerometer 25, and the gyroscope 26 may be integrated into an inertial sensor or a multi-axis motion sensor. In one embodiment, one of the accelerometer 25 and the gyroscope 26 may not be provided.

In one embodiment, the sensing device 20 is wearable. For example, the user wears the sensing device on the neck, hands, chest, waist, and/or feet. However, the wearing position of the sensing device 20 may still be changed according to actual requirements, and is not limited by the embodiment of the disclosure.

Hereinafter, the method according to the embodiment of the disclosure is described in conjunction with various devices and elements in the sensing system 1. Each process of the method may be adjusted according to the implementation, and is not limited to thereto.

Figure 2:
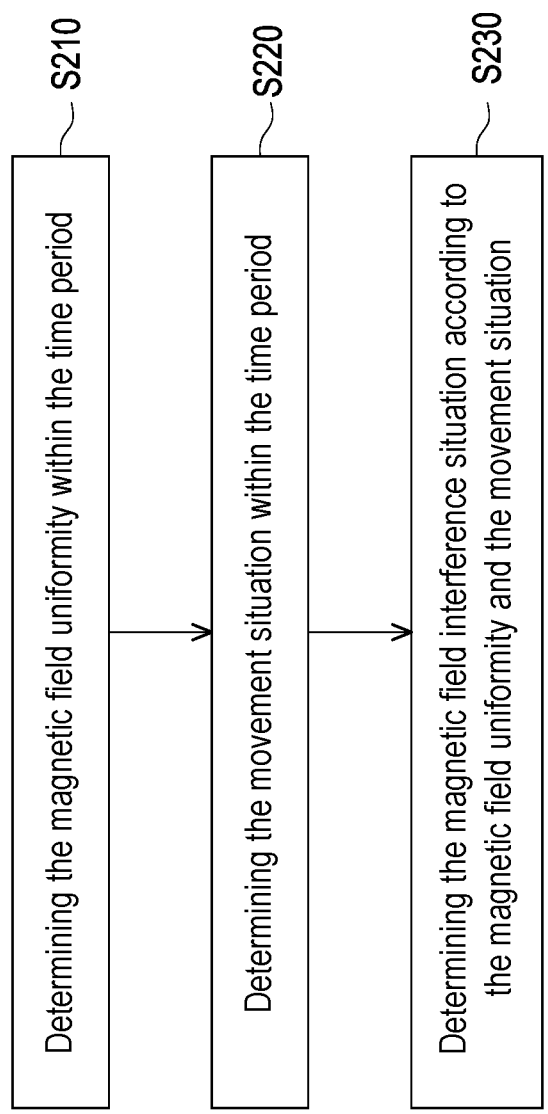
FIG. 2 is a flowchart of a method related to magnetic field interference according to an embodiment of the disclosure.

FIG. 2 is a flowchart of a method related to magnetic field interference according to an embodiment of the disclosure. Referring to FIG. 2, the processor 13 determines the magnetic field uniformity within the time period (step S210). Specifically, according to different design requirements, the processor 13 may define a time period such as 300 milliseconds, 500 milliseconds, or 1 second, but not limited thereto. In one embodiment, the magnetic field uniformity is one of a uniform state and a non-uniform state. A uniform state means that the magnetic fields at any two locations in a specific or predetermined environment are the same or differ by less than an allowable threshold. A non-uniform state means that the magnetic fields at any two locations in the environment may be different or the difference is greater than the allowable threshold. In some application scenarios, the interfered magnetic field may be in a non-uniform state.

In one embodiment, the processor 13 may define multiple magnetic field (interference) levels to represent different degrees of interference. For example, the magnetic field level includes a first level, a second level, and a third level. The first level is at a lowest degree of interference, the degree of interference of the second level is greater than that of the first level, and the degree of interference of the third level is greater than that of the second level. That is, the degree of interference is from small to large: the first level, the second level and the third level. In some application scenarios, the first level may be considered as the environment to which the magnetometer 24 belongs is clean and uninterfered, the second level may be considered as the environment is dirtier and slightly interfered, and the third level may be considered as the environment is the dirtiest and heavily interfered.

Figure 3:
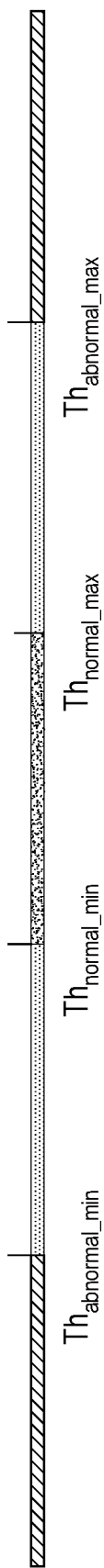
FIG. 3 is a schematic diagram of a magnetic field level section according to an embodiment of the disclosure.

FIG. 3 is a schematic diagram of a magnetic field level section according to an embodiment of the disclosure. Referring to FIG. 3, $Th_{normal\_min}$ is the normal lower limit, and is configured for determining whether the magnetic field interference belongs to the minimum limit of the first level. $Th_{normal\_max}$ is the normal upper limit, and is configured for determining whether the magnetic field interference belongs to the maximum limit of the first level. $Th_{abnormal\_min}$ is the abnormal lower limit, and is configured for determining whether the magnetic field interference belongs to the minimum limit of the second level. $Th_{abnormal\_max}$ is the abnormal upper limit, and is configured for determining whether the magnetic field interference belongs to the maximum limit of the second level. The abnormal lower limit $Th_{abnormal\_min}$ is less than the normal lower limit $Th_{normal\_min}$. The abnormal upper limit $Th_{abnormal\_max}$ is greater than the normal upper limit $Th_{normal\_max}$. That is, the normal magnetic field range between the normal lower limit $Th_{normal\_min}$ and the normal upper limit $Th_{normal\_max}$ is the range of the first level. The abnormal magnetic field range between the normal lower limit $Th_{normal\_min}$ and the abnormal lower limit $Th_{abnormal\_min}$ and the abnormal magnetic field range between the abnormal upper limit $Th_{abnormal\_max}$ and the normal upper limit $Th_{normal\_max}$ are the ranges of the second level. The range that is less than the abnormal lower limit $Th_{abnormal\_min}$ and greater than the abnormal upper limit $Th_{abnormal\_max}$ is the range of the third level.

The values of the normal lower limit $Th_{normal\_min}$, the abnormal lower limit $Th_{abnormal\_min}$, the normal upper limit $Th_{normal\_max}$, and the abnormal upper limit $Th_{abnormal\_max}$ may be adjusted according to actual requirements. For example, the normal lower limit $Th_{normal\_min}$, the abnormal lower limit $Th_{abnormal\_min}$, the normal upper limit $Th_{normal\_max}$, and the abnormal upper limit $Th_{abnormal\_max}$ are respectively 0.8, 0.6, 1.2, and 1.4 milligauss (mG).

It should be noted that, in other embodiments, it is also possible to be divided into other numbers of magnetic field levels, and the boundary values between the magnetic field levels may be adjusted according to actual requirements.

Figure 4:
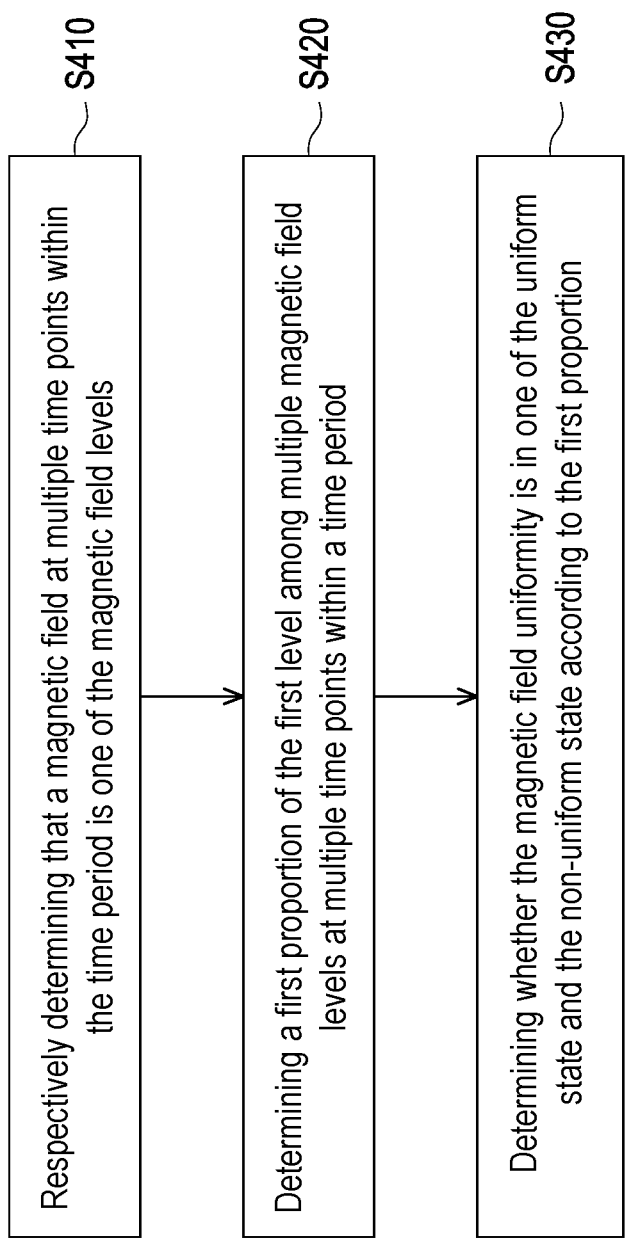
FIG. 4 is a decision-making flowchart of magnetic field uniformity according to an embodiment of the disclosure.

FIG. 4 is a decision-making flowchart of magnetic field uniformity according to an embodiment of the disclosure. Referring to FIG. 4, in one embodiment, the processor 13 may respectively determine that a magnetic field at multiple time points within the time period is one of the magnetic field levels (step S410). Specifically, the processor 13 may divide the time period into multiple time points. For example, the time period may be divided into 50, 60, or 100 time points. These time points may also be referred to as sampling points. That is, the processor 13 obtains the magnetic field sensed by the magnetometer 24 at each time/sampling point. Assuming that the time period is 1 second and there are 50 time points, it means that 50 magnetic field values are obtained every 1 second. For each time point, the processor 13 determines which magnetic field level the currently sensed magnetic field by the magnetometer 24 belongs to.

Figure 5:
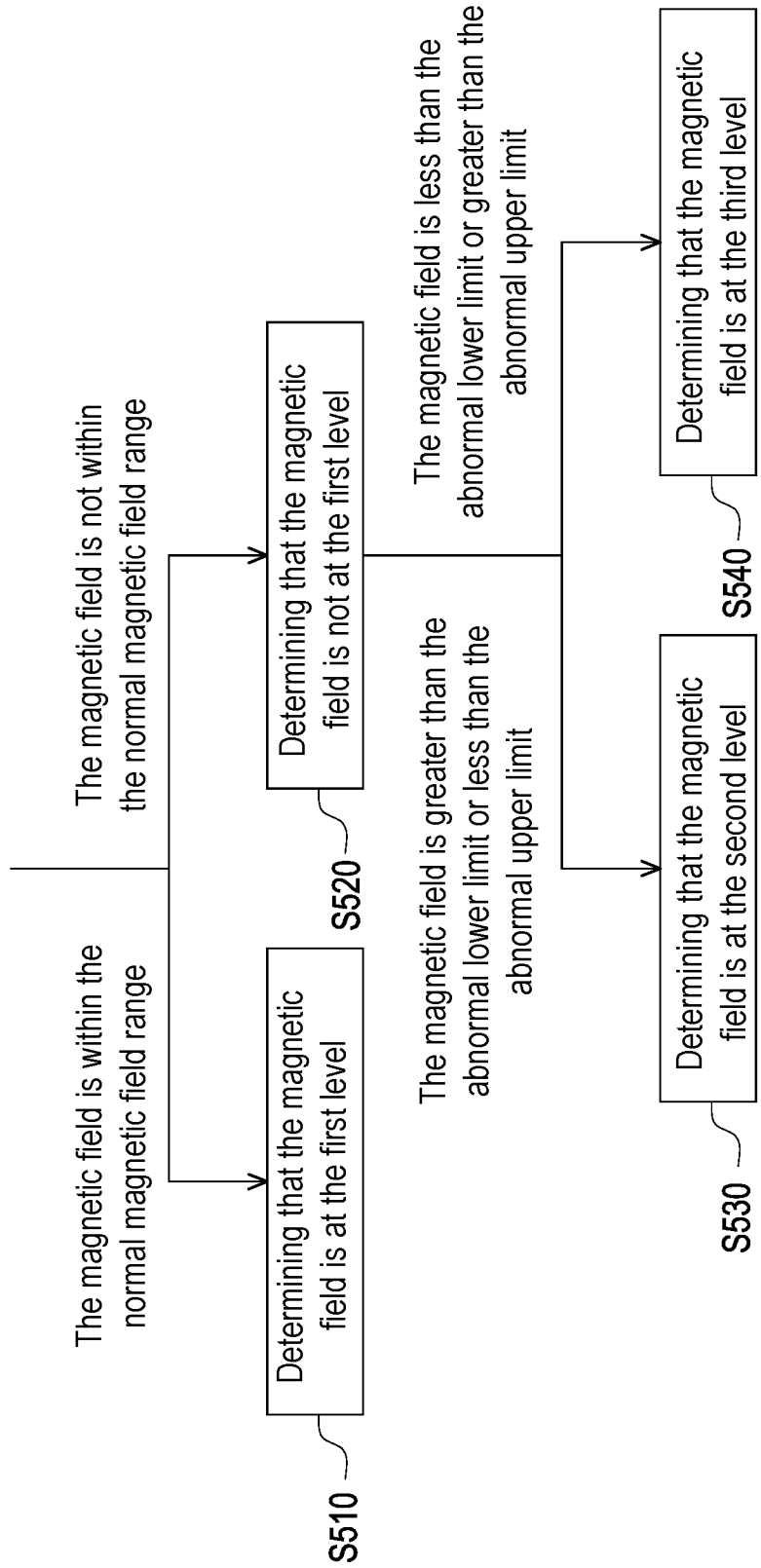
FIG. 5 is a decision-making flowchart of magnetic field level according to an embodiment of the disclosure.

FIG. 5 is a decision-making flowchart of magnetic field level according to an embodiment of the disclosure. Referring to FIG. 5, in one embodiment, taking the magnetic field level section of FIG. 3 as an example, in response to the magnetic field at the first time point among multiple time points in a certain time period being within the normal magnetic field range, the processor 13 may determine that the magnetic field of the first time point belongs to the first level (step S510). In addition, in response to the magnetic field at the first time point not being within the normal magnetic field range, the processor 13 may determine that the magnetic field of the first time point does not belong to the first level (step S520). For example, this magnetic field belongs to the second level or the third level. The first time point may be any one of multiple time points within a certain time period. The normal magnetic field range is the range between the normal lower limit $Th_{normal\_min}$ and the normal upper limit $Th_{normal\_max}$ (i.e., the range of the first level).

In the situation that the magnetic field at the first time point is not at the first level (i.e., the magnetic field is not within the normal magnetic field range), in response to the magnetic field at the first time point being within the abnormal magnetic field range (e.g., the magnetic field is less than the normal lower limit $Th_{normal\_min}$ and greater than the normal upper limit $Th_{normal\_max}$, and the magnetic field is greater than the abnormal lower limit $Th_{abnormal\_min}$ or less than the abnormal upper limit $Th_{abnormal\_max}$), the processor 13 may determine that the magnetic field at the first time point belongs to the second level (step S530). In addition, in response to the magnetic field at the first time point not being within the abnormal magnetic field range (e.g., the magnetic field is less than the normal lower limit $Th_{normal\_min}$ and greater than the normal upper limit $Th_{normal\_max}$, and the norm of the magnetic field is less than the abnormal lower limit $Th_{abnormal\_min}$ or greater than the abnormal upper limit $Th_{abnormal\_max}$), the processor 13 may determine that the magnetic field at the first time point does not belong to the second level and belongs to the third level (step S540).

It should be noted that, in other embodiments, the number and range of magnetic field levels may change, so the conditions for level decision-making may be adjusted accordingly.

Referring to FIG. 4, the processor 13 may determine a first proportion of the first level among multiple magnetic field levels at multiple time points within a time period (step S420). The first proportion is the ratio of the number of magnetic fields belonging to the first level at these time points to all the number of magnetic fields at these time points. The processor 13 may use the number of magnetic fields belonging to the first level within this time period as the representative value of the first ratio, or divide this number by the number of all time points in this time period as the representative value of the first proportion. For example, for a certain time period, according to the order of the time points, as long as the magnetic field at a certain time point belongs to the first level, the processor 13 may accumulate by one until the last time point in this time period. The processor 13 may use the final accumulated value in this time period as the representative value of the first proportion.

In another embodiment, the processor 13 may determine a second proportion of the second level among multiple magnetic field levels at multiple time points within a time period, and/or the processor 13 may determine a third proportion of the third level among multiple magnetic field levels at multiple time points within a time period. For the determination of the second proportion and the third proportion, reference may be made to the aforementioned description for the first proportion, and details are not repeated herein.

In one embodiment, the processor 13 may further convert these proportions into a histogram. For example, the horizontal axis of the histogram is divided into the magnetic field levels of these proportions, and the vertical axis is the value of these proportions.

Referring to FIG. 4, the processor 13 may determine whether the magnetic field uniformity is in one of the uniform state and the non-uniform state according to the first proportion corresponding to the first level (step S430). The processor 13 may compare the first proportion with the first proportion threshold, and determine the magnetic field uniformity according to the comparison result between the first proportion and the first proportion threshold.

Figure 6:
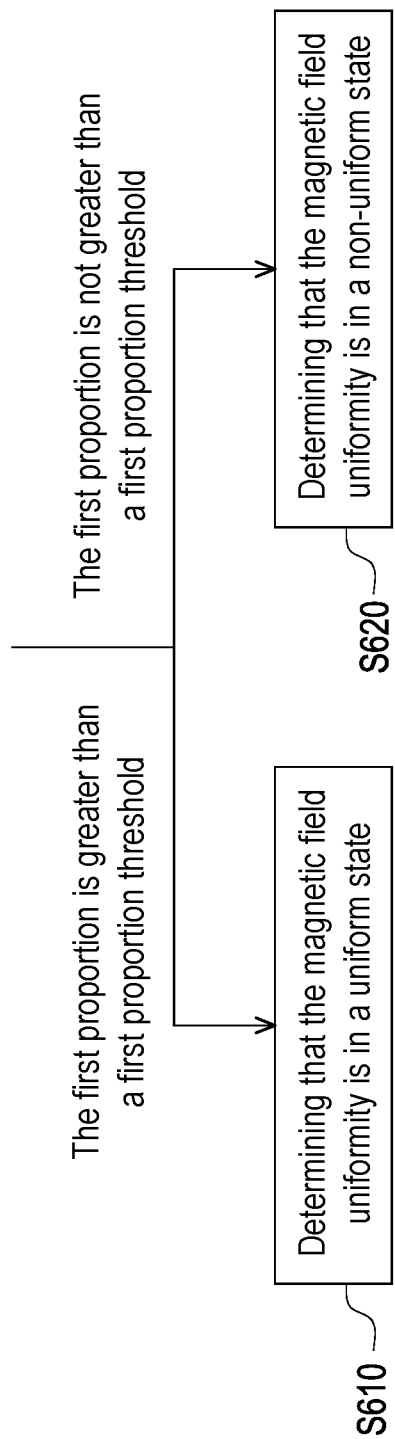
FIG. 6 is a decision-making flowchart of magnetic field uniformity according to an embodiment of the disclosure.

FIG. 6 is a decision-making flowchart of magnetic field uniformity according to an embodiment of the disclosure. Referring to FIG. 6, in step S430, in response to the first proportion in a certain time period being greater than the first proportion threshold, the processor 13 may determine that the magnetic field uniformity in this time period is in a uniform state (step S610). In addition, in response to the first proportion in a certain time period not being greater than the first proportion threshold, the processor 13 may determine that the magnetic field uniformity in this time period is in a non-uniform state (step S620).

For example, Formula (2) for decision-making of the magnetic field uniformity is as follows:

$$R_{first} \geq (W \times \text{pct } \%) \tag{2}$$

where R_first is the first proportion corresponding to the first level, W is the number of all time points in the time period, and pct is the initial proportion threshold (adjustable according to actual requirements). For example, if W is 50 and pct is 98, then at least 49 time points within a time period should have the magnetic field at the first level before evaluating the magnetic field uniformity of the current environment as in a uniform state. It should be noted that the first proportion in the Formula (2) takes the total number of magnetic fields belonging to the first level at multiple time points within a single time period as an example. If the first proportion is the value obtained by dividing the above total number by the number of all time points within the time period, the portion that is multiplied by W may be removed from Formula (2). That is, $R_{first} \geq$ pct %.

In other embodiments, the processor 13 may also compare the second/third proportion with the corresponding proportion threshold, and determine the magnetic field uniformity according to the comparison result between the second/third proportion and the corresponding proportion threshold. For example, if the second/third proportion is greater than the corresponding proportion threshold, the magnetic field uniformity is in a non-uniform state; if the second/third proportion is not greater than the corresponding proportion threshold, then the magnetic field uniformity is in a uniform state.

Referring to FIG. 2, the processor 13 determines the movement situation within the time period (step S220). Specifically, the movement situation is one of a moving state and a static state. The moving state means that the sensing device 20 is moving, and the static state means that the sensing device 20 is not moving or is static. The processor 13 may determine the movement situation of the sensing device 20 using sensing data obtained by other motion sensors other than the magnetometer 24 (e.g., the accelerometer 25 and/or the gyroscope 26).

Figure 7:
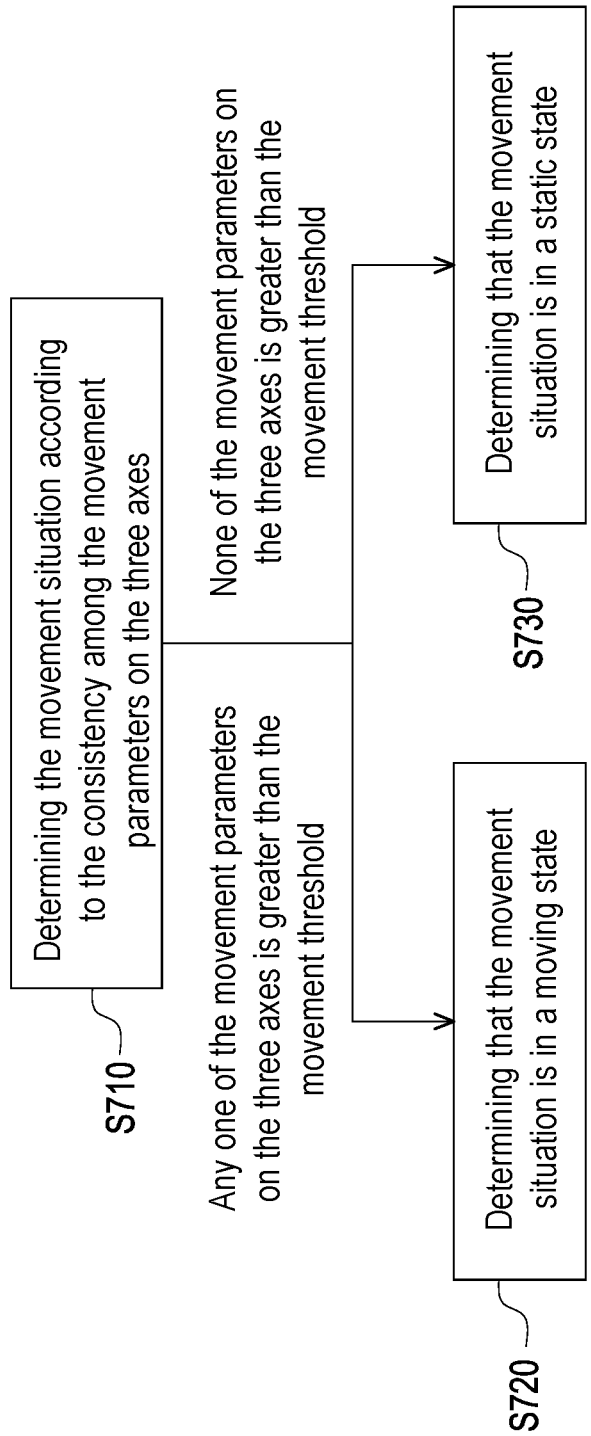
FIG. 7 is a decision-making flowchart of movement situation according to an embodiment of the disclosure.

FIG. 7 is a decision-making flowchart of movement situation according to an embodiment of the disclosure. Referring to FIG. 7, the processor 13 may determine the movement situation according to the consistency among the movement parameters on the three axes (step S710). Specifically, the three axes are, for example, X, Y, and Z axes perpendicular to each other in space. The movement parameter may be the standard deviation of acceleration or angular velocity over a time period. For example, Formula (3) is the movement parameter $Gyro_{P\_}SD$ taking angular velocity as an example:

$$Gyro_{P\_}SD = \sqrt{\frac{1}{W}\sum_{i=1}^{W}(Gyro_{P_i} - \overline{Gyro_P})^2} \quad (3)$$

where W is the number of all time points in the time period, P is any one of the three axes, $Gyro_{P_i}$ is the angular velocity of the P axis at time point i, and $\overline{Gyro_P}$ is the average value of the angular velocity of the P axis in the time period. As another example, Formula (4) is the movement parameter $Acc\_P\_SD$ taking acceleration as an example:

$$Acc_{P\_}SD = \sqrt{\frac{1}{W}\sum_{i=1}^{W}(Acc_{P_i} - \overline{Acc_P})^2} \quad (4)$$

where W is the number of all time points in the time period, P is any one of the three axes, $Acc_{P_i}$ is the acceleration of the P axis at time point i, and $\overline{Acc_P}$ is the average value of the acceleration of the P axis in the time period. In another embodiment, the movement parameter may also be an average value or other statistical values obtained by Formula (3) and Formula (4).

On the other hand, the consistency refers to the judgment result of whether none of the movement parameters on the three axes is greater than the movement threshold. In response to any one of the movement parameters on the three axes being greater than the movement threshold, the processor 13 may determine that the movement situation in this time period is in a moving state (step S720). That is, as long as the movement parameter on any axis is greater than the movement threshold, the sensing device 20 may be considered to be in a moving state. In addition, in response to none of the movement parameters on the three axes being greater than the movement threshold, the processor 13 may determine that the movement situation in this time period is in a static state (step S730).

Referring to FIG. 2, the processor 13 determines the magnetic field interference situation according to the magnetic field uniformity and the movement situation (step S230). Specifically, it has been proven by experiments that when the actual magnetic field uniformity in the environment is in a uniform state, no matter whether the movement situation is in a moving state or a static state, the magnetic field obtained based on the sensing data of the magnetometer 24 may accurately identify the uniform state. However, in the situation that the actual magnetic field uniformity of the environment is in a non-uniform state, no matter whether the movement situation is in a moving state or a static state, the magnetic field obtained only based on the sensing data of the magnetometer 24 may not be able to accurately identify the non-uniform state. For example, the current magnetic field may be deemed to be within the aforementioned normal magnetic field range, thereby misjudging it as the first state. It may be seen that if a magnetic field (e.g., the magnetic field F in Formula (1)) is used as a magnetic field interference index, it is effective in an environment with a uniform magnetic field, but it is not suitable for an environment with a non-uniform magnetic field. However, in most application situations, the sensing device 20 may be in a room, and the room may have a non-uniform magnetic field.

Figure 8:
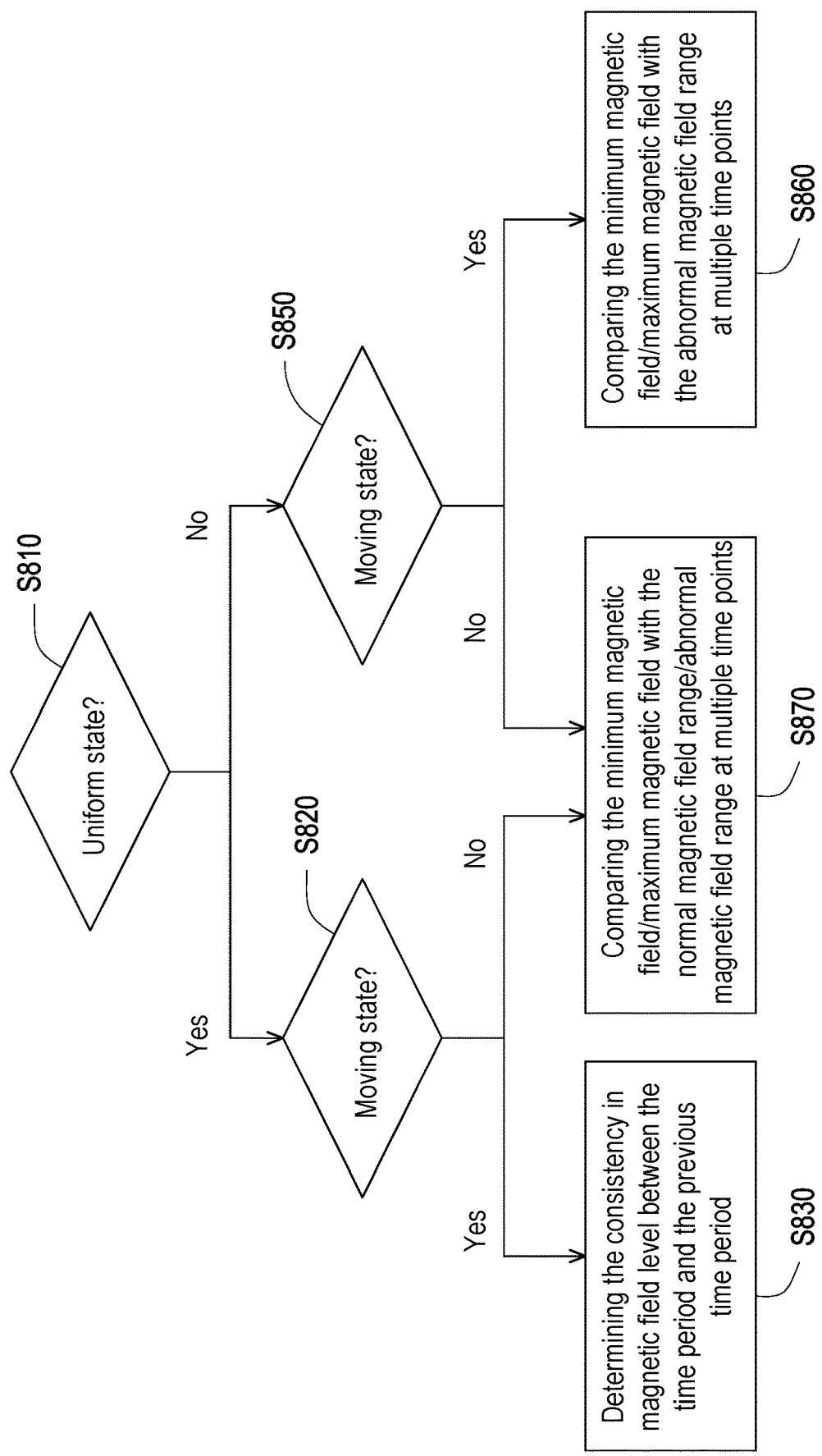
FIG. 8 is a decision-making flowchart of magnetic field interference according to an embodiment of the disclosure.

FIG. 8 is a decision-making flowchart of magnetic field interference according to an embodiment of the disclosure. Referring to FIG. 8, the processor 13 may determine whether the magnetic field uniformity is in a uniform state (step S810). In response to the magnetic field uniformity being in the uniform state, the processor 13 may determine whether the movement situation is in a moving state (step S820). For the determination of the movement situation and the magnetic field uniformity, reference may be made to the foregoing description, and details are not repeated herein.

In response to the magnetic field uniformity being in a uniform state and the movement situation being in a moving state, the processor 13 may determine the consistency in magnetic field levels between one or more previous time periods closest to the (current) time period and the time period (step S830). Specifically, the previous time period is earlier than the current time period, and the movement situation of the previous time period configured for judging consistency is in a moving state. For example, the time period is one second, and the previous time periods in the moving state are the previous one second and the previous two seconds. Consistency in magnetic field levels refers to whether the magnetic field levels in these time periods are the same.

In step S830, the processor 13 may use the magnetic field uniformity decision-making (Formula (2)) to determine whether it is a uniform magnetic field.

The magnetic field reflected in the uniform state may be configured to identify the magnetic field interference. As long as it is currently in a moving state and a uniform state, the processor 13 determines that the magnetic field interference is at the first level.

Next, the processor 13 may update the magnetic field interference situation in the previous time period in the moving state. For example, processor 13 updates the magnetic field interference situation of the penultimate closest previous time period to the closest magnetic field interference level, and updates the magnetic field interference situation of the closest previous time period to the magnetic field interference level (i.e., the first level) of the current time period, and so on for the rest.

Referring to FIG. 8, in response to the magnetic field uniformity being in the non-uniform state, the processor 13 may determine whether the movement situation is in a moving state (step S850). In response to the magnetic field uniformity being in a non-uniform state and the movement situation being in a moving state, the processor 13 may determine the minimum magnetic field/maximum magnetic field and the abnormal magnetic field range at multiple (or all of the) time points in the time period (step S860). Specifically, in a non-uniform state, the magnetic field interference situation is not at the first level with the lowest degree of interference. For example, the magnetic field interference situation is at the second level or the third level. The minimum magnetic field F_min and the maximum magnetic field F_max may be respectively obtained by Formula (5) and Formula (6):

$$F_{min} = \text{Min}(F_0 \sim F_N) \quad (5)$$

$$F_{max} = \text{Max}(F_0 \sim F_n) \quad (6)$$

where Min( ) is for obtaining the minimum value, Max( ) is for obtaining the maximum value, $F_0$ is the $0^{th}$ time point, and FN is the $N^{th}$ time point. N is a positive integer, and N is less than or equal to the (total) number of all time points in a single time period (e.g., the aforementioned W).

In addition, taking FIG. 3 as an example, the abnormal magnetic field range is the range that is greater than the abnormal lower limit $Th_{abnormal\_min}$ and less than the normal lower limit $Th_{normal\_min}$, or the range that is greater than the normal upper limit $Th_{normal\_max}$ and less than the abnormal upper limit $Th_{abnormal\_max}$.

Figure 9:
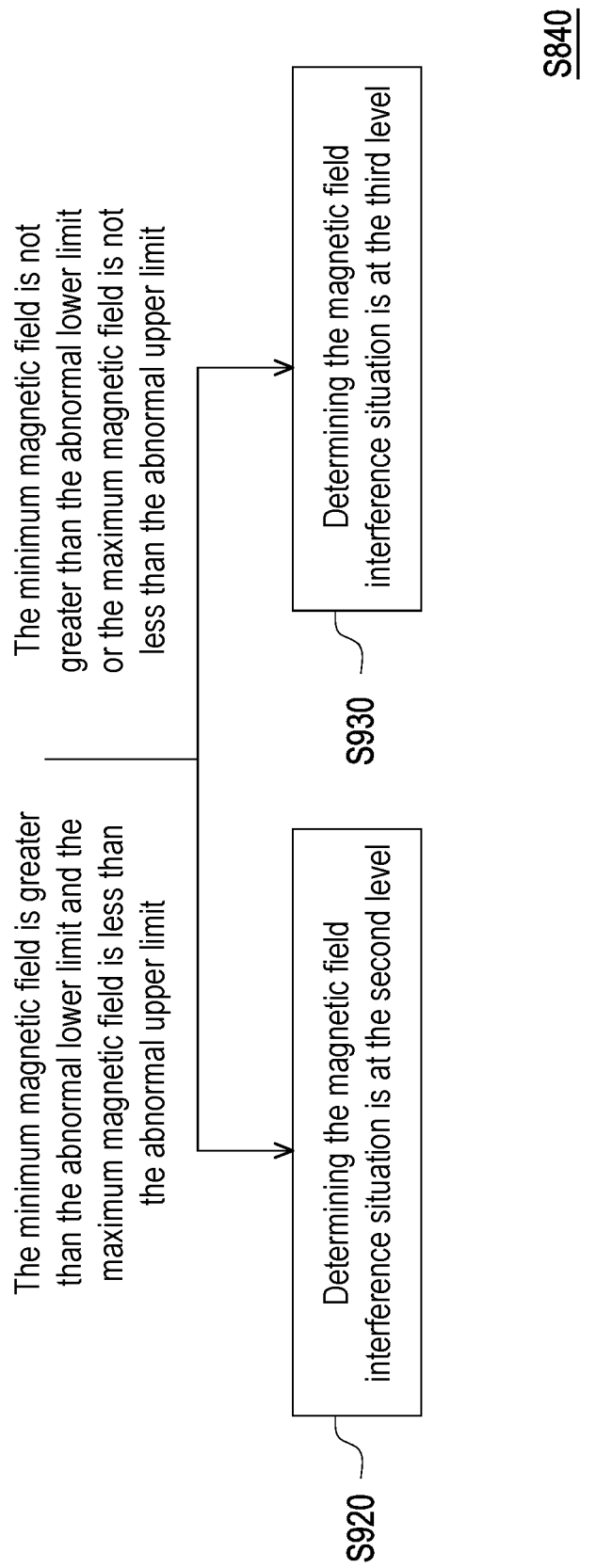
FIG. 9 is a decision-making flowchart of magnetic field interference in a moving state according to another embodiment of the disclosure.

FIG. 9 is a decision-making flowchart of magnetic field interference in a moving state according to another embodiment of the disclosure. Referring to FIG. 9, in step S860, in response to the minimum magnetic field in multiple (or all of the) time points in the time period being greater than the abnormal lower limit and the maximum magnetic field in these time points being less than the abnormal upper limit, the processor 13 may determine the magnetic field interference situation is at the second level (step S920). That is, even if the magnetic field interference situation is not at the first level with the lowest degree of interference, the maximum and minimum values of the magnetic field in this time period are still within the upper and lower limits of the abnormal magnetic field range corresponding to the second level, which means that the magnetic field interference situation has a higher chance of belonging to the second level.

In addition, in response to the minimum magnetic field in multiple (or all of the) time points in the time period not being greater than the abnormal lower limit or the maximum magnetic field in these time points not being less than the abnormal upper limit, the processor 13 may determine the magnetic field interference situation is at the third level (step S930). That is, the magnetic field interference situation is not at the first level with the lowest degree of interference, and the maximum and minimum values of the magnetic field in this time period are also not within the upper and lower limits of the abnormal magnetic field range corresponding to the second level, which means that the magnetic field interference situation has a higher chance of belonging to the third level.

Referring to FIG. 8, in response to the movement situation being in a static state, the processor 13 may compare the minimum magnetic field/maximum magnetic field with the normal magnetic field range/abnormal magnetic field range at multiple time points (step S870). Compared with step S860, the decision-making in the static state further compares the normal magnetic field range. In addition, taking FIG. 3 as an example, the normal magnetic field range is the range between the normal lower limit $Th_{normal\_min}$ and the normal upper limit $Th_{normal\_max}$.

Figure 10:
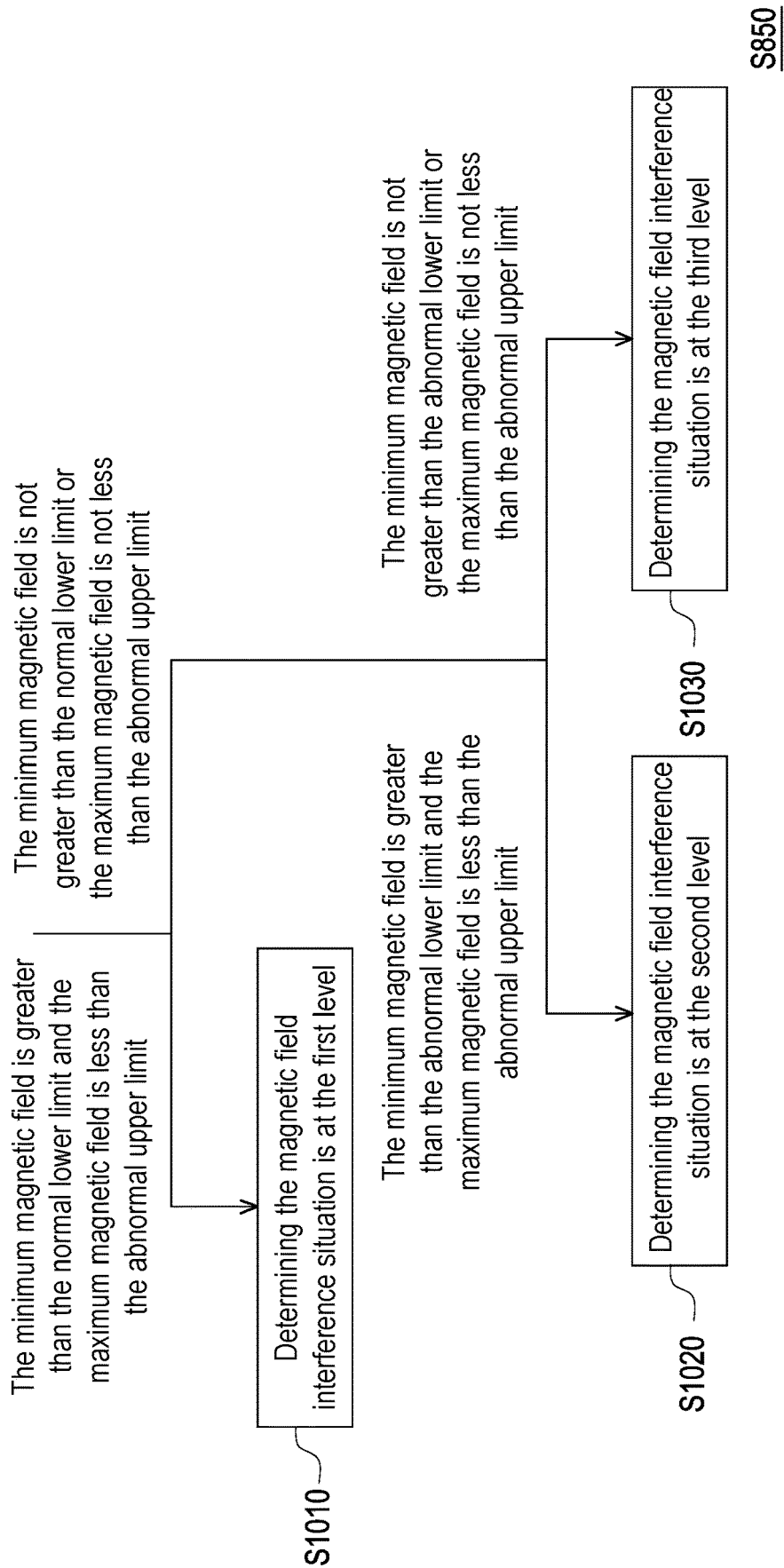
FIG. 10 is a decision-making flowchart of magnetic field interference in a static state according to an embodiment of the disclosure.

FIG. 10 is a decision-making flowchart of magnetic field interference in a static state according to an embodiment of the disclosure. Referring to FIG. 10, in step S870, in response to the minimum magnetic field in multiple (or all of the) time points in the time period being greater than the normal lower limit and the maximum magnetic field in these time points being less than the normal upper limit, the processor 13 may determine the magnetic field interference situation is at the first level (step S1010). That is, the maximum and minimum values of the magnetic field in this time period are still within the upper and lower limits of the normal magnetic field range corresponding to the first level, which means that the magnetic field interference situation has a higher chance of belonging to the first level.

When the minimum magnetic field is not greater than the normal lower limit or the maximum magnetic field is not less than the normal upper limit, in response to the minimum magnetic field being greater than the abnormal lower limit and the maximum magnetic field being less than the abnormal lower limit, the processor 13 may determine the magnetic field interference situation is at the second level (step S1020). That is, the maximum and minimum values of the magnetic field in this time period are still within the upper and lower limits of the abnormal magnetic field range corresponding to the second level, which means that the magnetic field interference situation has a higher chance of belonging to the second level.

In addition, when the minimum magnetic field is not greater than the normal lower limit or the maximum magnetic field is not less than the normal upper limit, in response to the minimum magnetic field not being greater than the normal lower limit or the abnormal lower limit, or the maximum magnetic field not being less than the abnormal upper limit, the processor 13 may determine the magnetic field interference situation is at the third level (step S1030). That is, the maximum and minimum values of the magnetic field in this time period are not within the upper and lower limits of the abnormal magnetic field range corresponding to the second level, which means that the magnetic field interference situation has a higher chance of belonging to the third level.

For the decision-making of the magnetic field interference situation in the static state, the embodiment of the disclosure proposes a two-stage decision-making. The embodiment described in FIG. 10 is preliminary decision-making, and the decision result may be further corrected.

Figure 11:
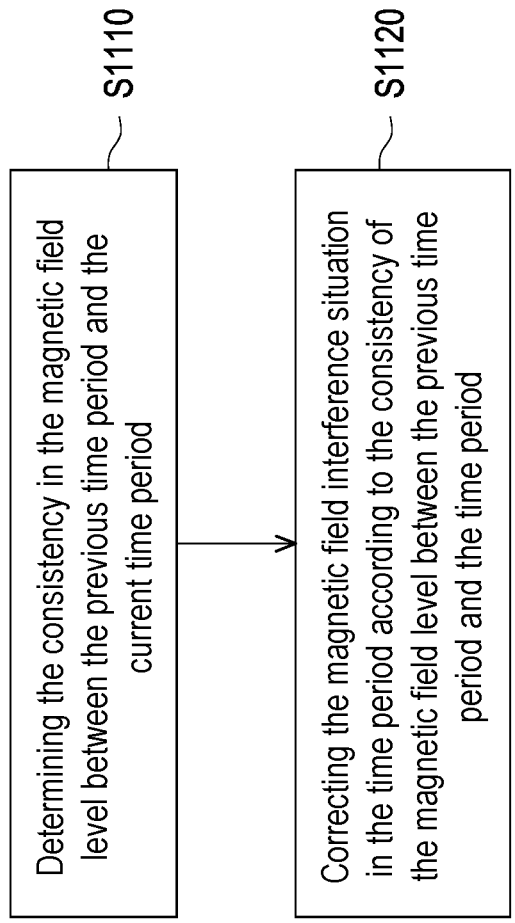
FIG. 11 is a correction flowchart of magnetic field interference according to an embodiment of the disclosure.

FIG. 11 is a correction flowchart of magnetic field interference according to an embodiment of the disclosure.

Referring to FIG. 11, the processor 13 may determine the consistency in the magnetic field levels between one or more previous time periods closest to the (current) time period and the current time period (step S1110). According to step S830, the previous time period is also in the moving state. That is, whether there is consistency between the magnetic field levels of the previous time period and the current time period in the moving state may be determined. For example, whether the magnetic field levels are the same for these time periods. The processor 13 may use the magnetic field interference situation in the current time period determined in FIG. 11 as the magnetic field level in the current time period. The magnetic field level in the previous time period is the magnetic field interference situation in the current time period determined in the previous time period.

The processor 13 may correct the magnetic field interference situation in the current time period according to the consistency of the magnetic field levels between one or more previous time periods and the current time period (step S1120). In one embodiment, as long as the current time period and the compared previous time period have different magnetic field interference situations, the processor 13 may select a magnetic field level corresponding to more severe interference between the current time point and the compared previous time period, and the selected magnetic field level is used as the magnetic field interference situation in the current time period. In response to the fact that the magnetic field interference in the current time period is the same as the compared previous time period, the processor 13 may maintain or not correct the magnetic field interference in the current time period.

For example, in response to the magnetic field interference situation in the current time period being the first level and the magnetic field interference situation in the previous time period being the second level, the magnetic field interference situation in the current time period is corrected to the second level; in response to the magnetic field interference situation in the current time period being the first level and the magnetic field interference situation in the previous time period being the third level, the magnetic field interference situation in the current time period is corrected to the third level; in response to the magnetic field interference situation in the current time period being the second level and the magnetic field interference situation in the previous time period being the third level, the magnetic field interference situation in the current time period is corrected to the third level; in response to the magnetic field interference situation in the current time period being the first level and the magnetic field interference in the previous time period also being the first level, the magnetic field interference situation in the current time period is still at the first level and not corrected.

In one embodiment, when the current time period and the compared previous time period have different magnetic field interference situations, in response to the magnetic field level of the time period being the initial level, the magnetic field level of one or more previous time periods that are compared not being the initial level, and the fourth proportion of the magnetic field at multiple (or all of the) time points within this time period that belongs to the initial level being less than the second proportion threshold, the processor 13 may correct the initial level to another one of the magnetic field levels (i.e., different from the initial level). Specifically, the initial level is at the second level or the third level determined in FIG. 10 or FIG. 11. That is, the fourth proportion may be the aforementioned second proportion or the third proportion. If the ratio of time points in the current time period that is at the second level or the third level is not large and is different from the magnetic field level of the previous time period, the judgment of the second level or the third level may be ignored, thereby relaxing the identification restrictions and reducing the number of times of being judged as the second level or the third level.

In addition, the second proportion threshold may be W×5%, where W is the number of all time points in the time period. However, 5% may also be replaced by other percentages, for example, 3%, 8%, or 10%.

Figure 12:
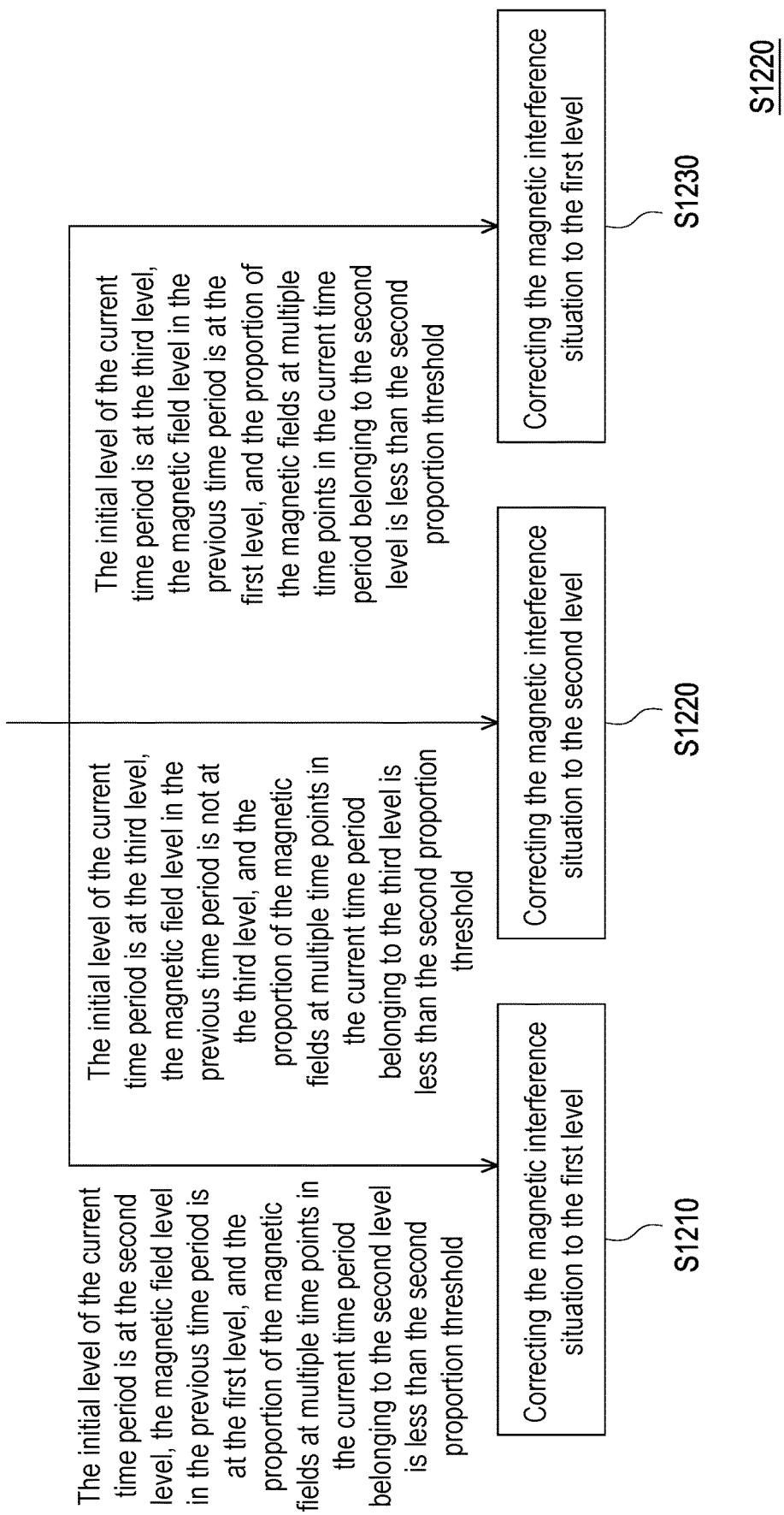
FIG. 12 is a correction decision-making flowchart according to an embodiment of the disclosure.

For example, FIG. 12 is a correction decision-making flowchart according to an embodiment of the disclosure. Referring to FIG. 12, in step S1120, in response to the initial level of the current time period being the second level, the magnetic field level of the previous time period being the first level (i.e., not the second level or the third level), and the proportion of the magnetic field at multiple (or all of the) time points within the current time period that belongs to the second level being less than the second proportion threshold, the processor 13 may correct the magnetic interference situation of the current time period to the first level (step S1210). That is, even if the second level is determined, when the magnetic field level of the previous time period in the moving state is not at the second level or the third level, and the proportion of the magnetic field at all time points in the current time period that is at the second level is smaller (i.e., less than the second proportion threshold), the chance of the magnetic field interference situation in the current time period being the first level is higher.

In response to the initial level of the current time period being the third level, the magnetic field level of the previous time period not being the third level (i.e., being the first level or the second level), and the proportion of the magnetic field at multiple (or all of the) time points within the current time period that belongs to the third level being less than the second proportion threshold, the processor 13 may correct the magnetic interference situation of the current time period to the second level (step S1220). That is, even if the third level is determined, when the magnetic field level of the previous time period in the moving state is not at the third level, and the proportion of the magnetic field at all time points in the current time period that is in the third level is smaller (i.e., less than the second proportion threshold), the chance of the magnetic field interference situation in the current time period being the second level is higher.

In response to the initial level of the current time period being the third level, the magnetic field level of the previous time period being the first level (i.e., not being the second level or the third level), and the proportion of the magnetic field at multiple (or all of the) time points within the current time period that belongs to the second level being less than the second proportion threshold, the processor 13 may correct the magnetic interference situation of the current time period to the first level (step S1230). That is, even if the third level is determined, when the magnetic field level of the previous time period in the moving state is not at the second level or the third level, and the proportion of the magnetic field at all time points in the current time period that is at the second level is smaller (i.e., less than the second proportion threshold), the chance of the magnetic field interference situation in the current time period being the first level is higher.

Thereby, when the sensing device 20 is in a non-uniform magnetic field, the embodiment of the disclosure may accurately identify that the magnetic field interference situation is a situation with more interference. For example, the magnetic field interference situation is in the second level or the third level.

Figure 13:
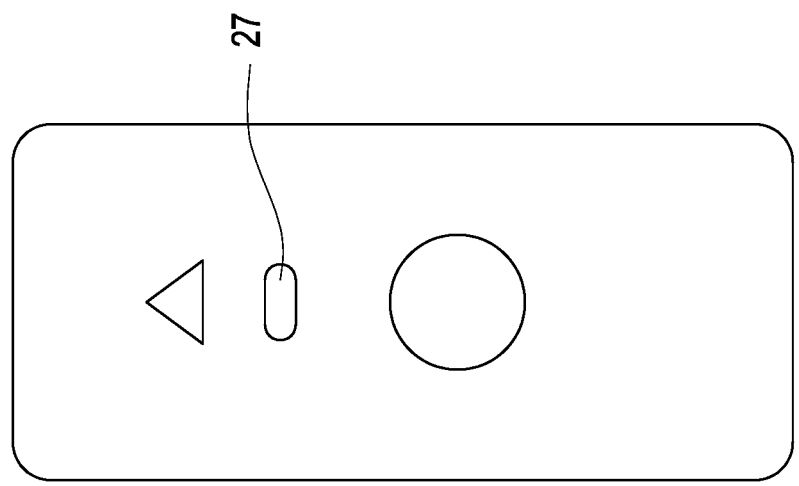
FIG. 13 is a schematic diagram of a sensing device according to an embodiment of the disclosure.

FIG. 13 is a schematic diagram of a sensing device 20 according to an embodiment of the disclosure. Referring to FIG. 20, the sensing device 20 may further include a light source 27. Different colors or flickering frequencies of the light source 27 may correspond to multiple magnetic field levels. For example, a green light or no light corresponds to the first level, a yellow light or light flashing once per second corresponds to the second level, and a red light or constant light corresponds to the third level. In this way, the user may be reminded of the magnetic field of the current environment, so that the user may perform corresponding response according to the color of the light source or the flickering frequency. For example, when the magnetic field interference in the current environment is at the second level, the user may quickly pass through the environment. When the magnetic field interference situation in the current environment is at the third level, the user may leave the environment.

In another embodiment, the computing device 10 or the sensing device 20 may further include a speaker (not shown), which is configured to emit voice or sound when the interference is relatively large (e.g., the magnetic field interference situation is at the third level).

Figure 14:
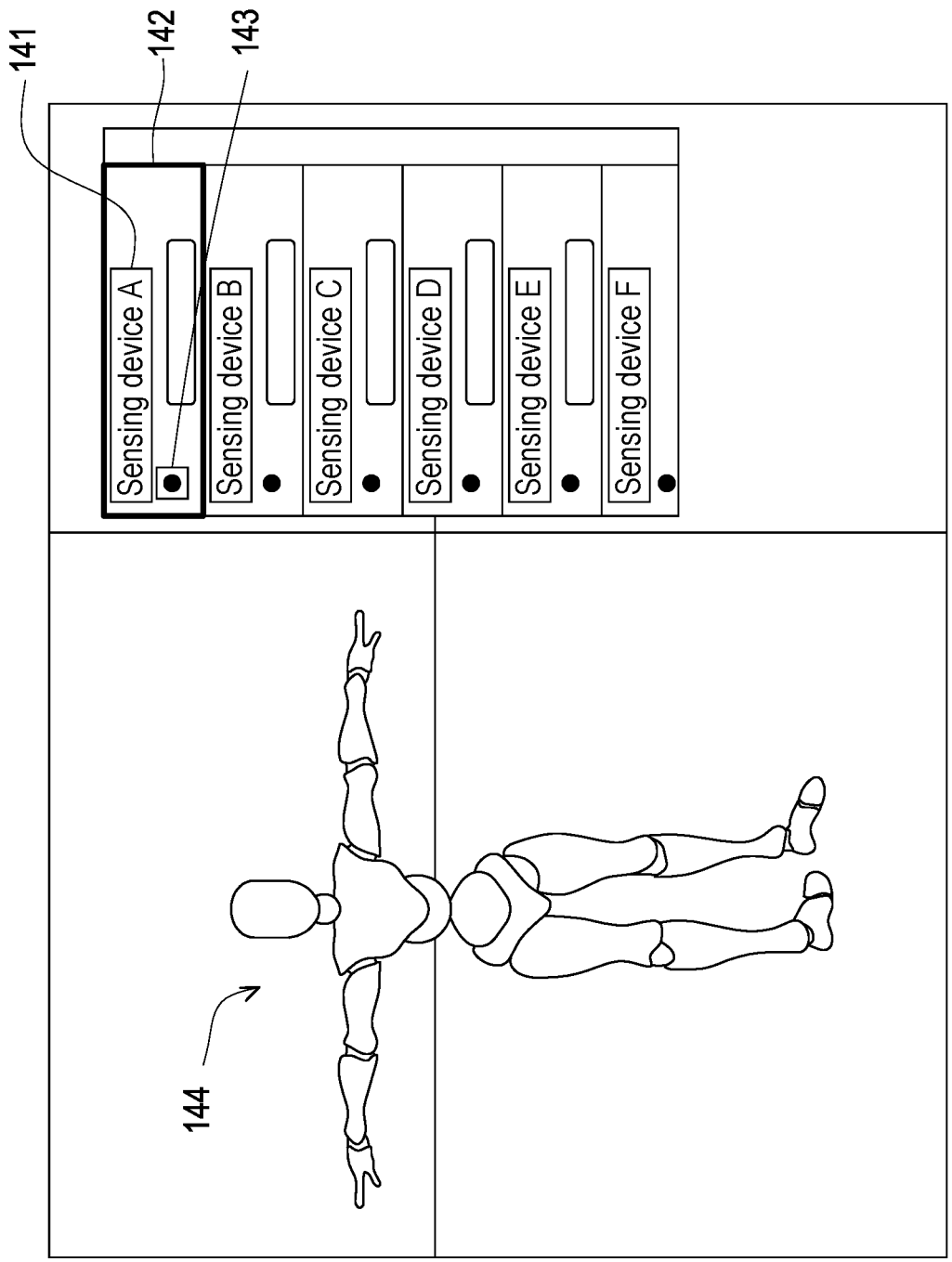
FIG. 14 is a schematic diagram of a user interface according to an embodiment of the disclosure.

FIG. 14 is a schematic diagram of a user interface UI according to an embodiment of the disclosure. Referring to FIG. 14, the computing device 10 may further include a display (not shown). The display is configured to present a user interface UI. The user interface UI also presents the device name 141, other information 142 (e.g., movement parameters, magnetic field, or sampling rate), and the magnetic field interference situation 143. The device name 141 is the name of each sensing device 20. The content of other information 142 may be adjusted or omitted according to actual requirements. The magnetic field interference situation 143 may use different colors or patterns to distinguish different magnetic field levels. For example, a green or a circle pattern corresponds to the first level, a yellow or a triangle pattern corresponds to the second level, and a red or an "X" pattern corresponds to the third level. In addition, the processor 13 may determine the attitude angle corresponding to the sensing device 20 or its wearing part according to the sensing data of the magnetometer 24, the accelerometer 25, and/or the gyroscope 26, and synchronize the corresponding attitude on the virtual avatar 144 accordingly.

Figure 15:
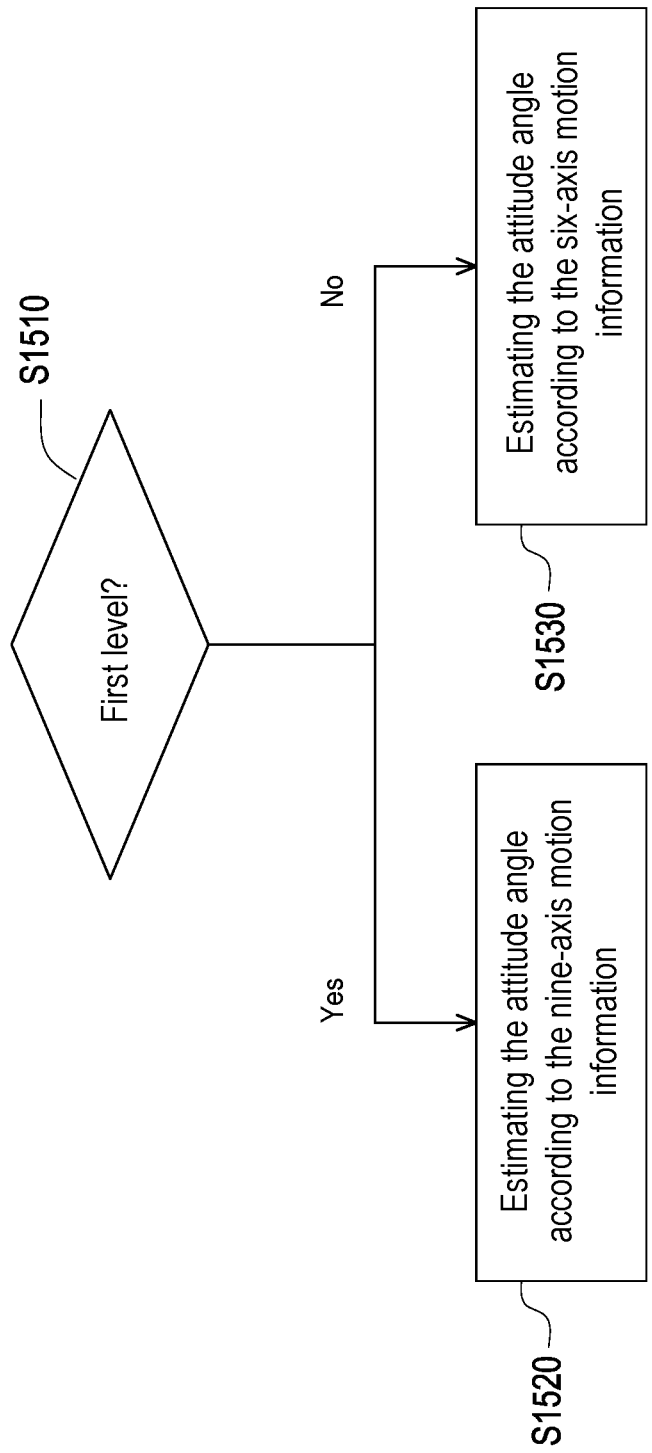
FIG. 15 is a flowchart of attitude angle estimation according to an embodiment of the disclosure.

FIG. 15 is a flowchart of attitude angle estimation according to an embodiment of the disclosure. Referring to FIG. 15, the processor 13 may determine whether the magnetic field interference situation is at the first level with the lowest degree of interference (step 1510). In response to the magnetic field interference situation being the first level, the processor 13 may estimate the attitude angle according to the nine-axis motion information (step S1520). Specifically, the nine-axis motion information is also called the nine-degree-of-freedom information. The nine degrees of freedom include the information of the three-axis/degree-of-freedom magnetometer 24, the three-axis/degree-of-freedom accelerometer 25, and the three-axis/degree-of-freedom gyroscope 26. That is, the nine-axis motion information also refers to the magnetic field obtained based on the sensing data of the magnetometer 24. For example, the magnetic field F of Formula (1) may be referred to. Since the degree of interference of the first level is the lowest, the magnetic field obtained based on the sensing data of the magnetometer 24 may be trusted or the accuracy of the magnetic field is relatively high. Although the attitude angle may be obtained by integrating the angular velocity measured by the gyroscope 26 with time, using the gyroscope 26 with poor accuracy (e.g., large noise) accumulates errors in the calculation process, resulting in angle deviation. Using the nine-axis motion information to estimate the attitude angle may effectively solve the problem of angle deviation of the gyroscope 26. For example, using the magnetic field of the Earth to correct for angle deviations of rotation around a vertical axis. In addition, attitude angles may be represented by quaternions or Euler angles.

However, in response to the magnetic field interference situation not being the first level, the processor 13 may estimate the attitude angle according to the six-axis motion information (step S1530). Specifically, the six degrees of freedom in the six-axis motion information only include the three-axis/degree-of-freedom accelerometer 25 and the three-axis/degree-of-freedom gyroscope 26. That is, the six-axis motion information does not refer to the magnetic field obtained based on the sensing data of the magnetometer 24. Since the degree of interference of levels different from the first level is relatively high, the magnetic field obtained based on the sensing data of the magnetometer 24 cannot be easily trusted or the accuracy of the magnetic field is relatively low. Therefore, the magnetic field obtained based on the sensing data of the magnetometer 24 may be excluded/ignored.

In one embodiment, in response to the magnetic field interference situation being the second level, the processor 13 may select six-axis or nine-axis motion information to estimate the attitude angle according to the duration of the magnetic field interference situation. In response to the magnetic field interference situation being the third level, and the processor 13 may directly estimate the attitude angle according to the six-axis motion information. At this time, the sensing data of the magnetometer 24 may cause a larger attitude angle deviation, so the six-axis motion information with a slightly lower deviation may be selected.

To sum up, in the method related to magnetic field interference and the sensing system in the embodiments of the disclosure, both the magnetic field uniformity and the movement situation are considered, and the magnetic field interference situation is determined accordingly. In the moving state, the magnetic field interference situation in the uniform state may be determined as the lowest interference, and the magnetic field level may be determined according to the maximum magnetic field and the minimum magnetic field in the non-uniform state. In the static state, in addition to the maximum magnetic field and the minimum magnetic field, the magnetic field interference situation of the previous time period in the moving state is also referred to. In addition, for the magnetic field interference situation with a magnetic field level of higher interference, whether to correct the magnetic field interference situation may be confirmed according to the magnetic field interference situation and the proportion of the magnetic field level of the previous time period. In this way, the accuracy of determining the magnetic field interference situation may be improved, and the attitude angle may be suitably reminded or corrected.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A method related to magnetic field interference, comprising:
   determining magnetic field uniformity within a time period based on a magnetic field within the time period detected by a magnetometer of a sensing device, wherein the magnetic field uniformity is in one of a uniform state and a non-uniform state, and determining the magnetic field uniformity within the time period comprises:
      respectively determining that the magnetic field at a plurality of time points within the time period is one of a plurality of magnetic field levels;
      determining a first proportion of a first level among the magnetic field levels at the time points; and
      determining whether the magnetic field uniformity is in one of the uniform state and the non-uniform state according to the first proportion;
   determining a movement situation within the time period;
   determining magnetic field interference situation according to the magnetic field uniformity and the movement situation; and
   indicating a level of a determined magnetic field interference situation by the sensing device with at least one of a light, a sound, a color on a user interface (UI), or a pattern on the UI corresponding to the level of the determined magnetic field interference situation.

2. The method related to magnetic field interference according to claim 1, wherein determining whether the magnetic field uniformity is in one of the uniform state and the non-uniform state according to the first proportion comprises:
   in response to the first proportion being greater than a first proportion threshold, determining that the magnetic field uniformity is in the uniform state; and
   in response to the first proportion not being greater than the first proportion threshold, determining that the magnetic field uniformity is in the non-uniform state.

3. The method related to magnetic field interference according to claim 1, wherein respectively determining that the magnetic field at the time points within the time period is one of the magnetic field levels comprises:
   in response to a magnetic field at a first time point among the time points being within a normal magnetic field range, determining that the magnetic field belongs to the first level; and
   in response to the magnetic field at the first time point not being within the normal magnetic field range, determining that the magnetic field does not belong to the first level.

4. The method related to magnetic field interference according to claim 1, wherein the movement situation is in one of a moving state and a static state, determining the movement situation within the time period comprises:
   determining the movement situation according to consistency among the movement parameters on three axes, wherein
   in response to any one of the movement parameters on the three axes being greater than a movement threshold, determining that the movement situation is in a moving state; and
   in response to none of the movement parameters on the three axes being greater than the movement threshold, determining that the movement situation is in a static state.

5. The method related to magnetic field interference according to claim 1, wherein the movement situation is in a moving state, and determining the magnetic field interference situation according to the magnetic field uniformity and the movement situation comprises:
   determining whether at least one previous time period closest to the time period has a same magnetic field level as the time period, wherein the at least one previous time period is earlier than the time period, and a movement situation of the at least one previous time period is in the moving state;
   in response to the time period and the at least one previous time period being the same magnetic field level, determining that the magnetic field interference situation is at a first level, wherein the first level is at a lowest degree of interference; and
   in response to the time period and the at least one previous time period not being the same magnetic field level, determining that the magnetic field interference situation is not at the first level.

6. The method related to magnetic field interference according to claim 1, wherein the movement situation is in a moving state, and determining the magnetic field interference situation according to the magnetic field uniformity and the movement situation comprises:
   in response to a minimum magnetic field at a plurality of time points within the time period being greater than an abnormal lower limit and a maximum magnetic field at the time points being less than an abnormal upper limit, determining that the magnetic field interference situation is at a second level, wherein a degree of interference of the second level is greater than a degree of interference of the first level, and the first level is at a lowest degree of interference; and
   in response to the minimum magnetic field not being greater than the abnormal lower limit or the maximum magnetic field not being less than the abnormal upper limit, determining that the magnetic field interference situation is at a third level, wherein a degree of interference of the third level is greater than the degree of interference of the second level.

7. The method related to magnetic field interference according to claim 1, wherein the movement situation is in a static state, and determining the magnetic field interference situation according to the magnetic field uniformity and the movement situation comprises:
   in response to a minimum magnetic field at a plurality of time points within the time period being greater than a normal lower limit and a maximum magnetic field at the time points being less than a normal upper limit, determining that the magnetic field interference situation is at a first level, wherein the first level is at a lowest degree of interference; and
   in response to the minimum magnetic field not being greater than the normal lower limit or the maximum magnetic field not being less than the normal upper limit:
   in response to the minimum magnetic field being greater than an abnormal lower limit and the maximum magnetic field being less than an abnormal upper limit, determining that the magnetic field interference situation is at a second level, wherein a degree of interference of the second level is greater than a degree of interference of the first level; and
   in response to the minimum magnetic field not being greater than the abnormal lower limit or the maximum magnetic field not being less than the abnormal upper limit, determining that the magnetic field interference situation is at a third level, wherein a degree of interference of the third level is greater than the degree of interference of the second level.

8. The method related to magnetic field interference according to claim 7, wherein determining the magnetic field interference situation according to the magnetic field uniformity and the movement situation comprises:
determining consistency in magnetic field levels between at least one previous time period closest to the time period and the time period, wherein the at least one previous time period is earlier than the time period, and a movement situation of the at least one previous time period is in the moving state;
correcting the magnetic field interference situation in the time period according to the consistency of the magnetic field levels between the at least one previous time period and the time period.

9. The method related to magnetic field interference according to claim 8, wherein correcting the magnetic field interference situation in the time period comprises:
in response to a magnetic field level of the time period being an initial level, a magnetic field level of the at least one previous time period not being the initial level, and a second proportion of the magnetic field at the time points within the time period that belongs to the initial level being less than a second proportion threshold, correcting the initial level to another one of the magnetic field levels.

10. The method related to magnetic field interference according to claim 1, further comprising:
in response to the magnetic field interference situation being a first level, estimating an attitude angle according to nine-axis motion information, wherein the first level is at a lowest degree of interference, and the nine-axis motion information refers to a magnetic field; and
in response to the magnetic field interference situation not being the first level, estimating the attitude angle according to six-axis motion information, wherein the six-axis motion information does not refer to the magnetic field.

11. A sensing system, comprising:
a computing device, comprising:
a memory, storing program code; and
a processor, loading the program code to execute:
determining magnetic field uniformity within a time period based on a magnetic field within the time period detected by a magnetometer of a sensing device;
determining a movement situation within the time period; and
determining magnetic field interference situation according to the magnetic field uniformity and the movement situation; and
the sensing device, comprising the magnetometer, wherein the magnetic field uniformity is in one of a uniform state and a non-uniform state, and the processor further executes:
respectively determining that a magnetic field at a plurality of time points within the time period is one of a plurality of magnetic field levels;
determining a first proportion of a first level among the magnetic field levels at the time points;
determining whether the magnetic field uniformity is in one of the uniform state and the non-uniform state according to the first proportion; and
indicating a level of a determined magnetic field interference situation by the sensing device with at least one of a light, a sound, a color on a user interface (UI), or a pattern on the UI corresponding to the level of the determined magnetic field interference situation.

12. The sensing system according to claim 11, wherein the processor further executes:
in response to the first proportion being greater than a first proportion threshold, determining that the magnetic field uniformity is in the uniform state; and
in response to the first proportion not being greater than the first proportion threshold, determining that the magnetic field uniformity is in the non-uniform state.

13. The sensing system according to claim 11, wherein the processor further executes:
in response to a magnetic field at a first time point among the time points being within a normal magnetic field range, determining that the magnetic field of the first time point belongs to the first level; and
in response to the magnetic field at the first time point not being within the normal magnetic field range, determining that the magnetic field of the first time point does not belong to the first level.

14. The sensing system according to claim 11, further comprising:
a sensing device, comprising an accelerometer or a gyroscope, and obtaining movement parameters on three axes, wherein the movement situation is in one of a moving state and a static state, and the processor further executes:
determining the movement situation according to consistency among the movement parameters on the three axes, wherein
in response to any one of the movement parameters on the three axes being greater than a movement threshold, determining that the movement situation is in a moving state; and
in response to none of the movement parameters on the three axes being greater than the movement threshold, determining that the movement situation is in a static state.

15. The sensing system according to claim 11, further comprising:
a sensing device, comprising a magnetometer, wherein the magnetometer detects a magnetic field, the movement situation is in a moving state, and the processor further executes:
determining whether at least one previous time period closest to the time period has a same magnetic field level as the time period, wherein the at least one previous time period is earlier than the time period, and a movement situation of the at least one previous time period is in the moving state;
in response to the time period and the at least one previous time period being the same magnetic field level, determining that the magnetic field interference situation is at a first level, wherein the first level is at a lowest degree of interference; and
in response to the time period and the at least one previous time period not being the same magnetic field level, determining that the magnetic field interference situation is not at the first level; or
the processor further executes:
in response to a minimum magnetic field at a plurality of time points within the time period being greater than an abnormal lower limit and a maximum magnetic field at the time points being less than an abnormal upper limit, determining that the magnetic field interference situation is at a second level, wherein a degree of interference of the second level is greater than a degree of interference of the first level, and the first level is at a lowest degree of interference; and in response to the minimum magnetic field not being greater than the abnormal lower limit or the maximum magnetic field not being less than the abnormal upper limit, determining that the magnetic field interference situation is at a third level, wherein a degree of interference of the third level is greater than the degree of interference of the second level.

16. The sensing system according to claim 11, further comprising:

a sensing device, comprising a magnetometer, wherein the magnetometer detects a magnetic field, wherein the movement situation is in a static state, and the processor further executes:

in response to a minimum magnetic field at a plurality of time points within the time period being greater than a normal lower limit and a maximum magnetic field at the time points being less than a normal upper limit, determining that the magnetic field interference situation is at a first level, wherein the first level is at a lowest degree of interference; and in response to the minimum magnetic field not being greater than the normal lower limit or the maximum magnetic field not being less than the normal upper limit:

in response to the minimum magnetic field being greater than an abnormal lower limit and the maximum magnetic field being less than an abnormal upper limit, determining that the magnetic field interference situation is at a second level, wherein a degree of interference of the second level is greater than a degree of interference of the first level; and in response to the minimum magnetic field not being greater than the abnormal lower limit or the maximum magnetic field not being less than the abnormal upper limit, determining that the magnetic field interference situation is at a third level, wherein a degree of interference of the third level is greater than the degree of interference of the second level.

17. The sensing system according to claim 16, wherein the processor further executes:

determining consistency in magnetic field levels between at least one previous time period closest to the time period and the time period, wherein the at least one previous time period is earlier than the time period, and a movement situation of the at least one previous time period is in the moving state;

correcting the magnetic field interference situation in the time period according to the consistency of the magnetic field levels between the at least one previous time period and the time period, wherein the processor further executes:

in response to a magnetic field level of the time period being an initial level, a magnetic field level of the at least one previous time period not being the initial level, and a second proportion of the magnetic field at the time points within the time period that belongs to the initial level being less than a second proportion threshold, correcting the initial level to another one of the magnetic field levels.

18. The sensing system according to claim 11, further comprising:

a sensing device, comprising a magnetometer, wherein the magnetometer detects a magnetic field, wherein the processor further executes:

in response to the magnetic field interference situation being a first level, estimating an attitude angle according to nine-axis motion information, wherein the first level is at a lowest degree of interference, and the nine-axis motion information refers to the magnetic field; and in response to the magnetic field interference situation not being the first level, estimating the attitude angle according to six-axis motion information, wherein the six-axis motion information does not refer to the magnetic field.

* * * * *